(12) United States Patent  
Tsuruda

(10) Patent No.: US 7,508,706 B2
(45) Date of Patent: Mar. 24, 2009

(54) NONVOLATILE SEMICONDUCTOR MEMORY DEVICE PROVIDED WITH DATA REGISTER FOR TEMPORARILY HOLDING DATA IN MEMORY ARRAY

(75) Inventor: Tamaki Tsuruda, Chiyoda-ku (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 8 days.

(21) Appl. No.: 11/655,154

(22) Filed: Jan. 19, 2007

(65) Prior Publication Data

US 2007/0183200 A1 Aug. 9, 2007

(30) Foreign Application Priority Data

Jan. 26, 2006 (JP) ............................. 2006-018074

(51) Int. Cl.
G11C 11/34 (2006.01)

(52) U.S. Cl. ............................. 365/185.08; 365/185.25; 365/189.2; 365/203; 365/233.18; 711/154; 711/5

(58) Field of Classification Search ............ 365/185.08, 365/185.25, 189.02, 203, 233.18; 711/154, 711/5, 105
See application file for complete search history.

(56) References Cited

U.S. PATENT DOCUMENTS 6,675,269 B2 * 1/2004 Miura et al. ................. 711/154

FOREIGN PATENT DOCUMENTS

JP 06-223576 A 8/1994

* cited by examiner

Primary Examiner—Hoai V Ho
Assistant Examiner—Fernando N Hidalgo
(74) Attorney, Agent, or Firm—Buchanan Ingersoll & Rooney PC

(57) ABSTRACT

A precharge signal generation circuit outputs a precharge signal including a pulse every access cycle with respect to a data register in a first mode, and generates a precharge signal by masking the signal including the pulse every access cycle with respect to the data register when access to a memory cell other than a predetermined memory cell in the data register is designated in a second mode. A first precharge circuit precharges a bit line pair in response to activation of the precharge signal.

9 Claims, 14 Drawing Sheets

NONVOLATILE SEMICONDUCTOR MEMORY DEVICE PROVIDED WITH DATA REGISTER FOR TEMPORARILY HOLDING DATA IN MEMORY ARRAY

BACKGROUND OF THE INVENTION

1. Field of the Invention

The present invention relates to a nonvolatile semiconductor memory device, and more particularly, to a nonvolatile semiconductor memory device provided with a data register for temporarily holding data in a burst accessing nonvolatile memory array.

2. Description of the Background Art

Conventionally, a static random access memory (hereinafter, referred to as SRAM) and the like has been operated in random access and a bit line pair has been precharged every reading or writing cycle.

Meanwhile, there is disclosed a method for reducing power consumption at precharging by reducing the number of precharge operations to the bit line pair performed every change in an address, in, for example, Japanese Patent Laying-Open No. 06-223576.

That is, according to Japanese Patent Laying-Open No. 06-223576, when an address A is changed at a period 2T for a RAM part having k×n pieces of RAM cells constituted of k pieces (e.g. four pieces) of bit line pairs and n pieces of word lines, the address A is accessed from 0, 1, 2, 3, . . . successively according to a characteristic of the address access to a line memory. Thus, the bit line pair on a row side is not accessed again until four times accesses after the bit line pair is accessed once. Therefore, an AND processing is performed by an original precharge signal φ1 and the address A so as to perform the precharge operation to the bit line pair only when a minimum address (e.g. 00) comes at accessing the row side, and a new precharge signal φ1a is formed to perform the precharge operations only at 0, 4, 8, . . . addresses according to the φ1a.

Meanwhile, some electrically rewritable nonvolatile semiconductor memory devices such as a burst reading or writing flash memory are provided with a data register for temporarily holding read data from the flash memory and written data to the flash memory. When the data register includes a plurality of memory cells, the method disclosed in Japanese Patent Laying-Open No. 06-223576 is also used to reduce the power consumption by the bit line pair in the data register.

However, the method disclosed in Japanese Patent Laying-Open No. 06-223576 never perform precharging to the bit line pair until reaching a maximum column address and cannot cope with a case where it becomes necessary to precharge the bit line pair every reading or writing cycle.

SUMMARY OF THE INVENTION

It is an object of the present invention to provide a nonvolatile semiconductor memory device having a first mode for precharging a bit line pair every access cycle with respect to a memory cell in a data register, and a second mode for precharging the bit line pair when a specific memory cell in the data register is accessed.

A nonvolatile semiconductor memory device according to the present invention includes a nonvolatile memory cell array including a plurality of memory cells, a data register including a plurality of memory cells, for temporarily holding read data from the nonvolatile memory cell array and written data to the nonvolatile memory cell array, a signal generation circuit for outputting a first signal having a pulse every reading or writing cycle with respect to the data register in a first mode, and generating a first signal by masking the signal having the pulse every reading or writing cycle with respect to the data register when reading or writing with respect to a memory cell other than a predetermined memory cell in the data register is designated in a second mode, and a first precharge circuit for precharging a bit line pair connected to the memory cell in the data register in response to activation of the first signal, wherein the signal generation circuit cancels the masking when reading or writing with respect to the predetermined memory cell in the data register is designated in the second mode.

The nonvolatile semiconductor memory device of the present invention can be operated by selecting one of the first mode for precharging the bit line pair is precharged every access cycle with respect to the memory cell in the data register and the second mode for precharging the bit line pair when the specific memory cell in the data register is accessed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the drawings hereinafter.

(Whole Constitution)

Figure 1:
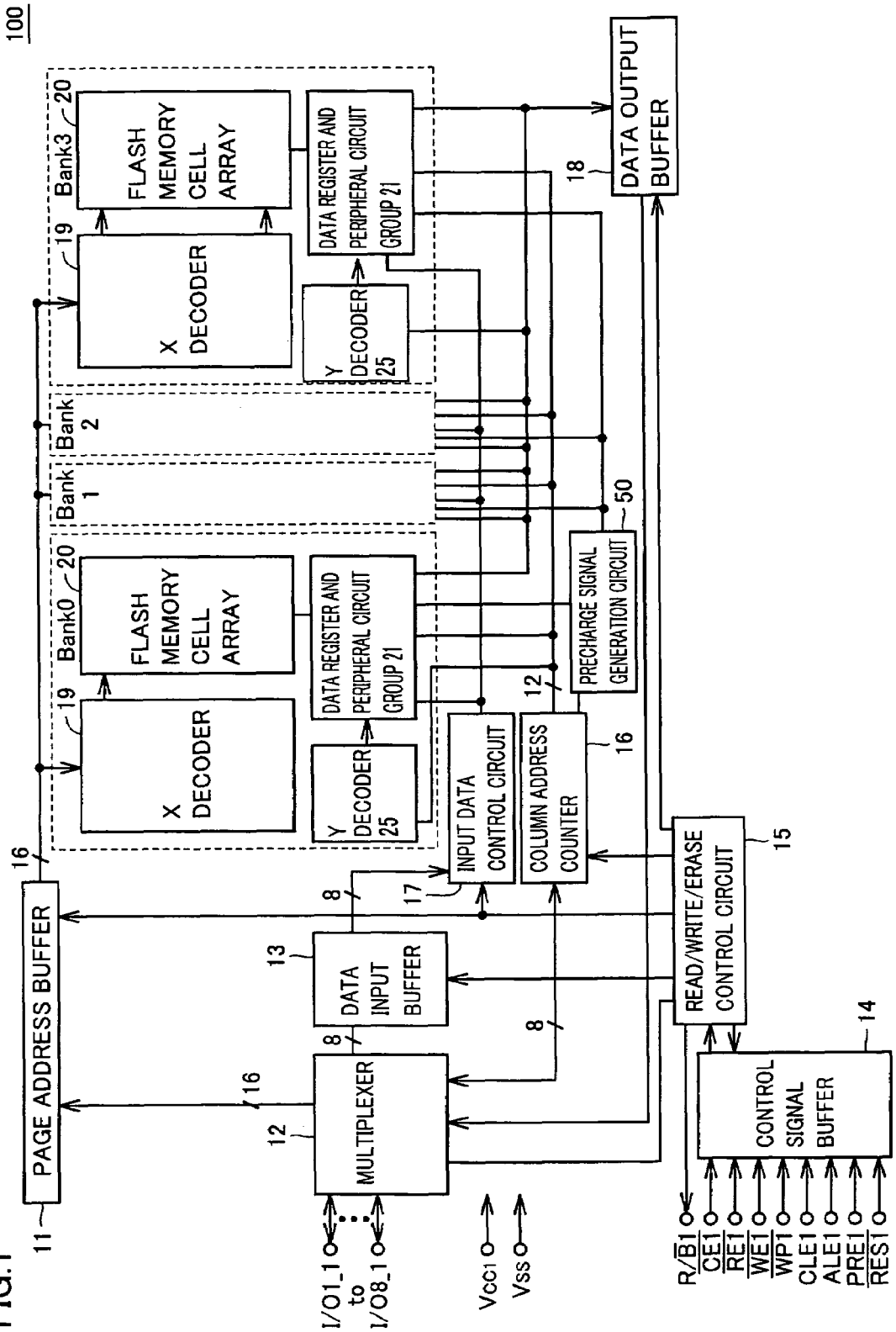
FIG. 1 is a view showing a constitution of a nonvolatile semiconductor memory device according to an embodiment of the present invention.

FIG. 1 is a view showing the constitution of a nonvolatile semiconductor memory device 100 according to an embodiment of the present invention.

Referring to FIG. 1, nonvolatile semiconductor memory device 100 includes a page address buffer 11, a multiplexer 12, a data input buffer 13, a control signal buffer 14, a read/write/erase control circuit 15, an input data control circuit 17, a column address counter 16, a precharge signal generation circuit 50, and a data output buffer 18.

Page address buffer 11 temporarily stores a page address signal.

Multiplexer 12 receives written data from the outside through a data input/output terminal and outputs it to data input buffer 13, receives read data from data output buffer 18 and outputs it to the outside through the data input/output terminal, and receives address data from the outside through the data input/output terminal and outputs it to column address counter 16 and read/write/erase control circuit 15.

Data input buffer 13 temporarily stores data inputted from the outside.

Control signal buffer 14 receives a clock signal and a control signal from the outside, generates an internal clock signal and an internal control signal and outputs them to a corresponding component in nonvolatile semiconductor memory device 100.

Read/write/erase control circuit 15 controls the reading operation of the data from a flash memory cell array 20, the writing operation of the data to flash memory cell array 20, and the erasing operation of the data in flash memory cell array 20.

Input data control circuit 17 controls the transfer of the written data from data input buffer 13 to a data register 23.

Column address counter 16 holds a counter value for burst reading of data from flash memory cell array 20 and for burst writing of data to flash memory cell array 20, and outputs an internal address signal based on the counter value.

Precharge signal generation circuit 50 generates a precharge signal for precharging a bit line pair. Precharge signal generation circuit 50 generates different precharge signals between a first mode and a second mode. The bit line pair is precharged every reading or writing cycle in the first mode. It is precharged in a maximum column address in the second mode. Precharge signal generation circuit 50 will be described in detail later.

Data output buffer 18 holds the data outputted from data register 23 temporarily, and outputs the data at the timing corresponding to the internal clock.

In addition, nonvolatile semiconductor memory device 100 includes four banks Bank0 to Bank3. Each bank includes an X decoder 19, flash memory cell array 20, and a data register and a peripheral circuit group 21.

X decoder 19 selects one of a plurality of word lines in flash memory cell array 20 in accordance with the page address signal outputted from page address buffer 11 and activates/deactivates the selected word line.

Y decoder 25 selects column of flash memory cell array 20 and column of data register 23 in accordance with column address counter 16.

Flash memory cell array 20 includes a plurality of memory cells. Each of the plurality of memory cells has a source and a drain formed on a well surface in a semiconductor substrate, a floating gate formed on the source and the drain with a gate insulation film (tunnel insulation film) interposed therebetween, and a control gate formed on the floating gate with an ONO (Oxide-Nitride-Oxide) film interposed therebetween. Each memory cell stores two-bit data. Burst reading (continuous in the column direction) or writing is performed in the memory cell in flash memory cell array 20.

(Constitution of Data Register and Peripheral Circuit Group 21)

Figure 2:
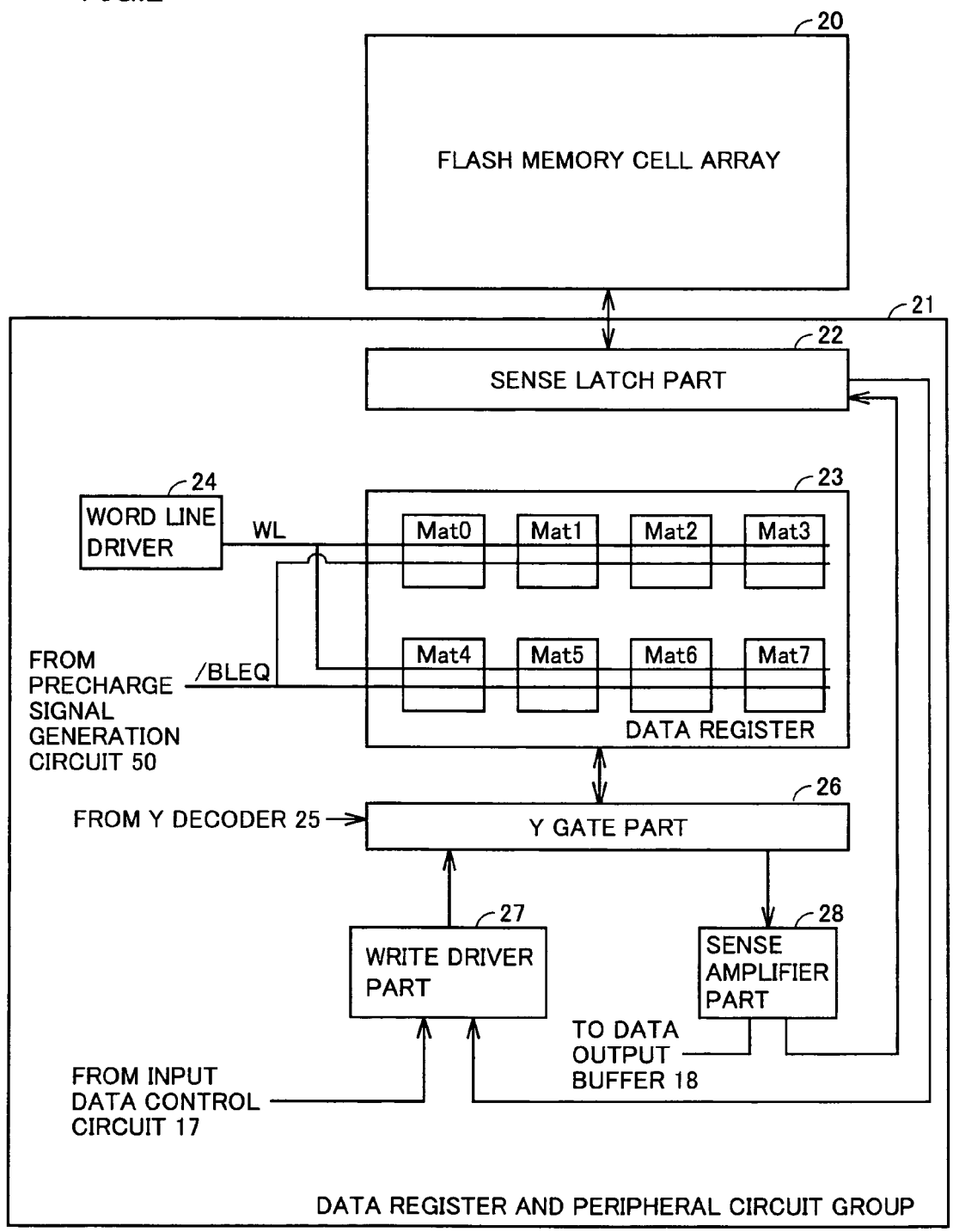
FIG. 2 is a view showing a constitution of a data register and a peripheral circuit group.

FIG. 2 is a view showing the constitution of data register and peripheral circuit group 21.

Referring to FIG. 2, data register and peripheral circuit group 21 includes a sense latch part 22, data register 23, a word line driver 24, a Y gate part 26, a write driver part 27, and a sense amplifier part 28.

Sense latch part 22 amplifies the data read from flash memory cell array 20 and temporarily holds the written data to flash memory cell array 20.

Data register 23 has eight mats Mat0 to Mat7. Each mat is divided into sub-mats. A common word line WL is provided through eight mats Mat0 to Mat7. In addition, a common precharge signal/BLEQ is supplied to eight mats Mat0 to Mat7.

When precharge signal/BLEQ is activated to "L" level, word line driver 24 deactivates word line WL to "L" level and when precharge signal/BLEQ is deactivated to "H," level, it activates word line WL to "H" level.

Write driver part 27 includes one write driver WD every sub-mat.

Sense amplifier part 28 includes one sense amplifier SA every sub-mat.

Y gate part 26 includes Y gates Y0 to Y7 for memory cells C0 to C7 in data resister 23, respectively.

A bus connecting sense latch part 22 to data register 23 has ×64-bit constitution, and a bus connecting input data control circuit 17 to data register 23 and a bus connecting data output buffer 18 to data register 23 are ×8-bit and ×16-bit constitutions, respectively.

(Constitution of Data Register 23)

Figure 3:
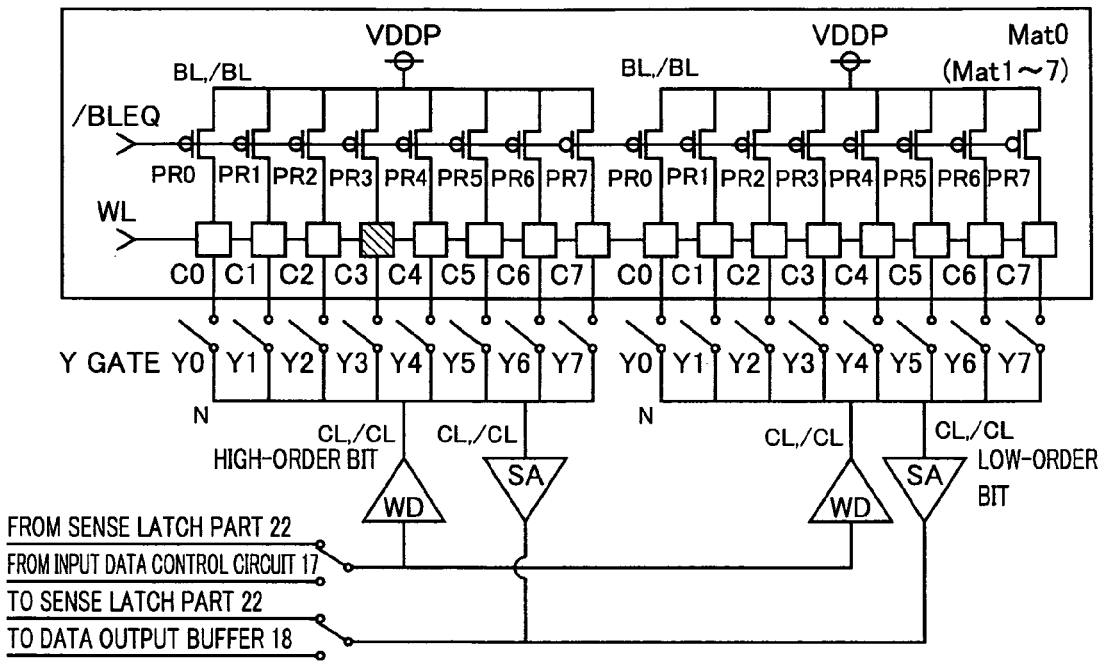
FIG. 3 is a view showing a mat in a data register and a constitution of a circuit connected to the mat.

FIG. 3 is a view showing one mat in data register 23 and a circuit constitution connected to the mat.

Referring to FIG. 3, each mat includes two sub-mats for a high-order bit and a low-order bit in accordance with 2 bits stored in the memory cell of flash memory cell array 20. Each sub-mat includes memory cells C0 to C7 and first precharge circuits PR0 to PR7.

First precharge circuits PR0 to PR7 receive precharge signal/BLEQ and when precharge signal/BLEQ becomes "L" level, it precharges connected bit line pair BL, /BL to a potential of VDDP.

Memory cells C0 to C7 are SRAM cells.

Figure 4:
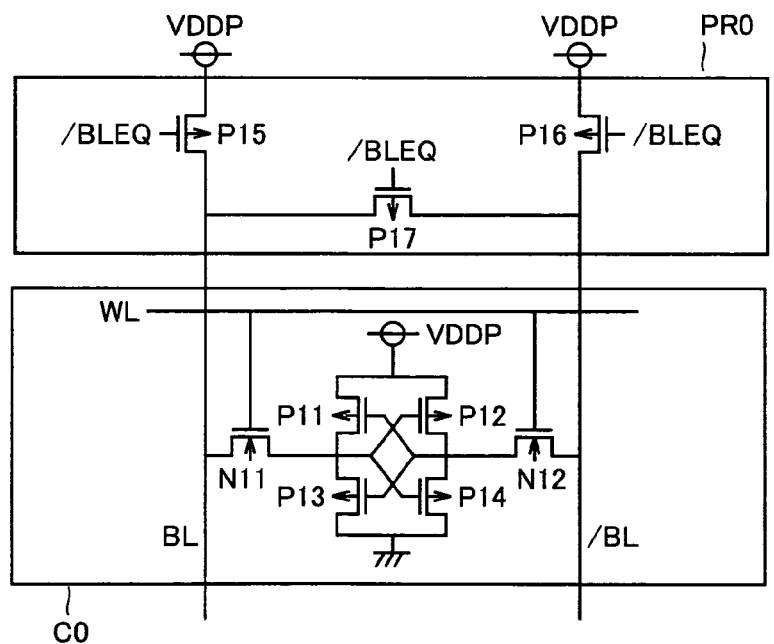
FIG. 4 is a view showing a constitution of a memory cell and a first precharge circuit.

FIG. 4 is a view showing the constitution of memory cell C0 and first precharge circuit PR0. Other memory cells C1 to C7 and first precharge circuits PR1 to PR7 are all the same.

Referring to FIG. 4, memory cell C0 is a SRAM cell including P channel MOS transistor P11 to P14 and N channel MOS transistors N11 and N12.

First precharge circuit PR0 includes P channel MOS transistors P15, P16 and P17. P channel MOS transistors P15, P16 and P17 are turned ON when precharge signal/BLEQ becomes "L" level and as a result, both bit lines BL and /BL are precharged to the potential of VDDP.

Referring to FIG. 3 again, each sub-mat includes a write driver WD and a sense amplifier SA.

When Y gates Y0 to Y7 are ON, memory cells C0 to C7 are connected to write driver WD and sense amplifier SA. The memory cells C0 to C7 are designated by column addresses. Memory cell C0 is designated by a minimum column address and memory cell C7 is designated by a maximum column address.

Y gates Y0 to Y7 control the connection/disconnection between the bit line pair, and sense amplifier SA and write driver WA. The Y gate connected to bit line pair BL, /BL corresponding to the designated column address (that is, bit line pair BL, /BL connected to the memory cell corresponding to the designated column address) is turned on for a predetermined time and other Y gates are OFF.

Write driver WD is connected to a common wiring pair CL, /CL connected to a common connection node N of eight bit line pairs BL, /BL connected to memory cells C0 to C7. Write driver WID transfers the data from sense latch part 22 or input data control circuit 17 to the memory cell in data register 23 through common wiring pair CL, /CL and bit line pair BL, /BL connected to the Y gate in ON state.

Sense amplifier SA is connected to common wiring pair CL, /CL connected to common connection node N of eight bit line pairs BL, /BL connected to memory cells C0 to C7. When the data in the memory cell in data register 23 is outputted, sense amplifier SA amplifies a potential difference between one common wiring pair CL, /CL to which the potential difference of bit line pair BL, /BL connected to the Y gate in ON state is applied and outputs it to data output buffer 18 or sense latch part 22.

(Operation of SLSRAM Transfer)

When the data is read from flash memory cell array 20, the readout data of the flash memory cell is amplified by sense latch part 22 and then transferred to data register 23. This transfer is referred to as a SLSRAM transfer hereinafter. Then, the readout data in data register 23 is amplified by sense amplifier SA and transferred to data output buffer 18. This transfer is referred to as a SRAMIO transfer hereinafter.

The SLSRAM transfer will be described hereinafter. The SRAMIO transfer will be described later.

At the SLSRAM transfer, the readout data is transferred from sense latch part 22 to each mat in data register 23 at the same time. The read out data is transferred to each mat such that it is transferred to the memory cell of the sub-mat for a high-order bit and then to the memory cell of the sub-mat for a low-order bit. In each sub-mat, the readout data is transferred to the memory cell in the order of C0, C1, . . . C7.

Figure 5:
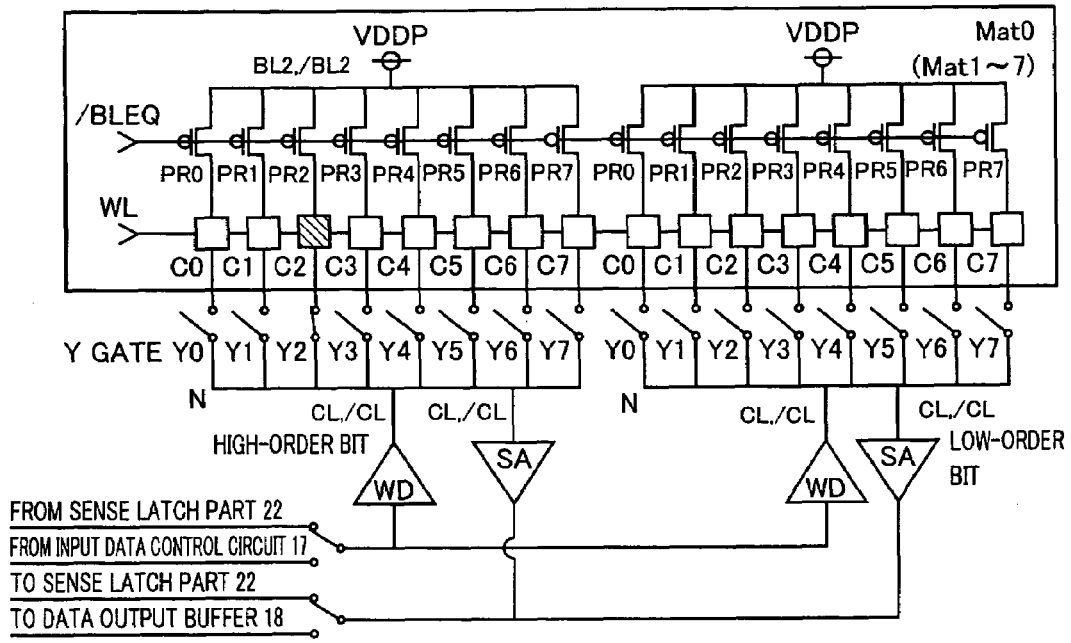
FIG. 5 is a view for explaining an operation of data register and peripheral circuit group when data in a flash memory cell array is transferred to memory cells in the sub-mats for a high-order bit of all mats in data register.

FIG. 5 is a view for explaining the operation of data register and peripheral circuit group 21 when the data of flash memory cell array 20 is transferred to memory cells C2 of the sub-mat for a high-order bit of all mats Mat0 to Mat 7.

Referring to FIG. 5, when the data is transferred to memory cell C2 of the sub-mat for a high-order bit, Y gate Y2 of the sub-mat for a high-order bit becomes ON and the data is transferred from write drive WD to memory cell C2 of the sub-mat for a high-order bit.

Figure 6:
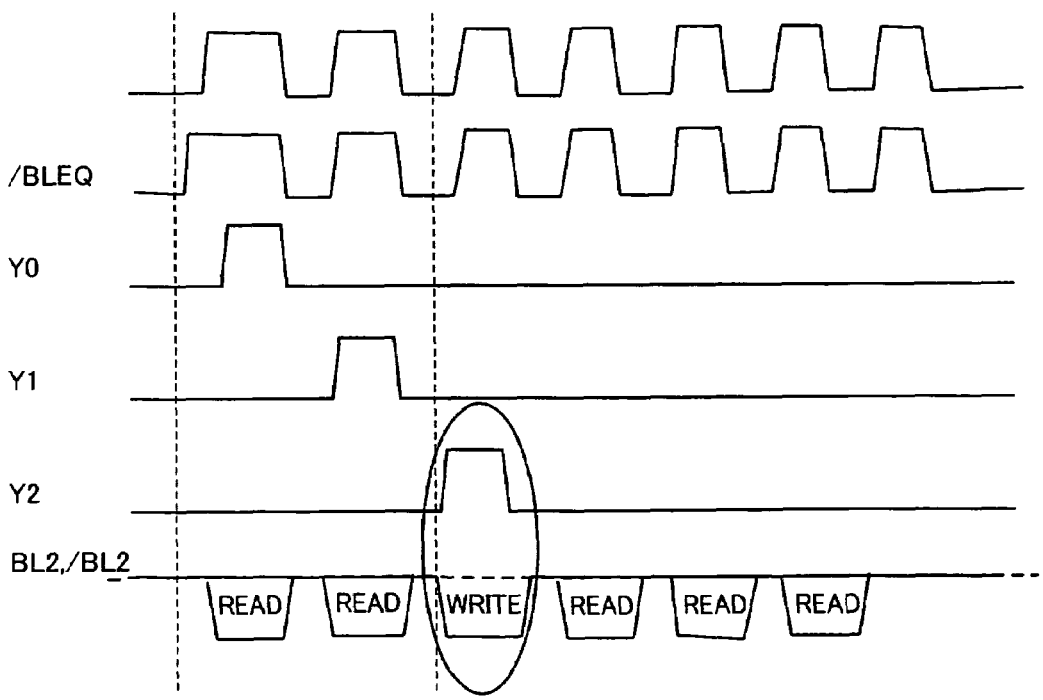
FIG. 6 is a schematic view showing a timing chart at a SLSRAM transfer in a first mode.

FIG. 6 is a schematic view showing a timing chart at the SLSRAM transfer in the first mode.

Referring to FIG. 6, precharge signal/BLEQ is deactivated to "H," level first. Thus, first precharge circuits PR0 to PR7 finish precharging of all bit line pairs BL, /BL.

In addition, in response to the deactivation of precharge signal/BLEQ to "H" level, word line driver 24 activates word line WL to "H," level.

Then, Y gates Y0 of the sub-mat for a high-order bit of all mats Mat0 to Mat7 are turned ON and the readout data of the flash memory is outputted from write driver WD to memory cell C0 and written in data register 23.

Then, precharge signal/BLEQ is activated to "L" level. Thus, word line driver 24 deactivates word line WL to "L" level and then first precharge circuits PR0 to PR7 precharge all bit line pairs BL, /BL.

Then, precharge signal/BLEQ is deactivated to "H," level. Thus, first precharge circuits PR0 to PR7 finish precharging of all bit line pairs BL, /BL. In addition, in response to deactivate of precharge signal/BLEQ to "H," level, word line driver 24 activates word line WL to "H," level.

Then, Y gates Y1 of the sub-mat for a high-order bit of all mats Mat0 to Mat7 are turned ON and the readout data of the flash memory is outputted from write driver WD to memory cell C1 and written in data register 23.

Then, precharge signal/BLEQ is activated to "L" level. Thus, word line driver 24 deactivates word line WL to "L" level and then first precharge circuits PR0 to PR7 precharge all bit line pairs BL, /BL.

Then, precharge signal/BLEQ is deactivated to "H" level. Thus, first precharge circuits PR0 to PR7 finish precharging of all bit line pairs BL, /BL. In addition, in response to deactivation of precharge signal/BLEQ to "H" level, word line driver 24 activates word line WL to "H" level.

Then, Y gates Y2 of the sub-mat for a high-order bit of all mats Mat0 to Mat7 are turned ON and the readout data of the flash memory is outputted from write driver WD to memory cells C2 and written in data register 23. At this time, as shown in FIG. 6, bit line pair BL2, /BL2 connected to memory cell C2 is changed to the level corresponding to the readout data of the flash memory.

Then, precharge signal/BLEQ is activated to "L" level. Thus, word line driver 24 deactivates word line WL to "L" level and then first precharge circuits PR0 to PR7 precharge all bit line pairs BL, /BL.

Then, precharge signal/BLEQ is deactivated to "H" level. Thus, first precharge circuits PR0 to PR7 finish precharging of all bit line pairs BL, /BL. In addition, in response to deactivation of precharge signal/BLEQ to "H" level, word line driver 24 activates word line WL to "H" level.

Similarly, the above operations are repeated with respect to Y gates Y3 to Y7 of sub-mats for a high-order bit of all mats Mat0 to Mat7.

Then, the above operations are repeated with respect to the sub-mat for a low-order bit of all mats Mat0 to Mat7.

In addition, although the data is written in response to ON of Y gate Y2, the reason why the data of bit line pair BL, /BL is changed in other cycles is that read data is outputted because word line WL is activated. However, since Y2 gate is OFF, the read data is not transferred to common wiring pair CL, /CL.

Figure 7:
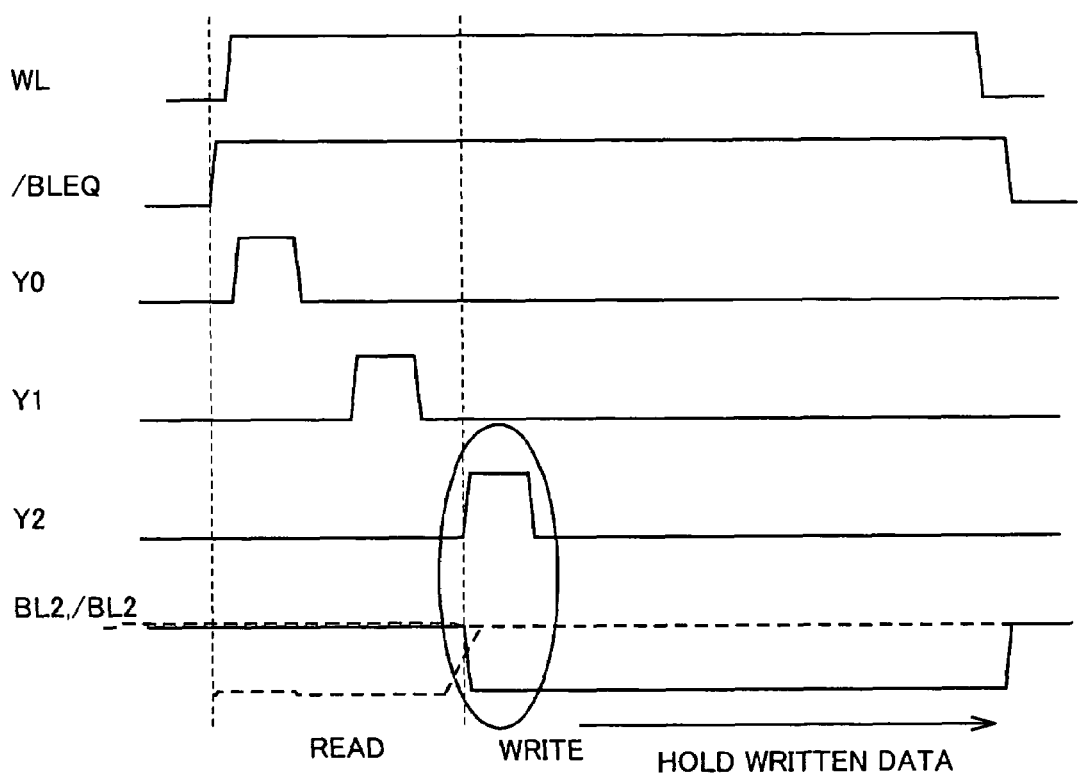
FIG. 7 is a schematic view showing a timing chart at the SLSRAM transfer in a second mode.

FIG. 7 is a schematic vies showing a timing chart at the SLSRAM transfer in the second mode.

Referring to FIG. 7, precharge signal/BLEQ is deactivated to "H" level first. Then, first precharge circuits PR0 to PR7 finish the precharging of all bit line pairs BL, /BL.

In addition, in response to the deactivation of precharge signal/BLEQ to "H" level, word line driver 24 activates word line WL to "H" level.

Then, Y gates Y0 of the sub-mats for a high-order bit of all mats Mat0 to Mat7 are turned ON and the readout data of the flash memory is outputted from write driver WD to memory cell C0 and written in data register 23.

Then, Y gates Y1 of the sub-mats for a high-order bit of all mats Mat0 to Mat7 are turned ON and the readout data of the flash memory is outputted from write driver WD to memory cells C1 of the sub-mats for a high-order bit of all Mat0 to Mat7 and written in data register 23.

Then, Y gates Y2 of the sub-mats for a high-order bit of all mats Mat0 to Mat7 are turned ON and the readout data of the flash memory is outputted from write driver WD to memory cells C2 of the sub-mats for a high-order bit of all mats Mat0 to Mat7 and written in data register 23. At this time, as shown in FIG. 7, bit line pair BL, /BL2 connected to memory cell C2 is changed to the level corresponding to the readout data of the flash memory.

Thus, the above operations are repeated for Y gates Y3, Y4, Y5 and Y6 of the sub-mats for a high-order bit of all mats Mat0 to Mat7.

Finally, Y gates Y7 of the sub-mats for a high-order bit of all mats Mat0 to Mat7 are turned ON and the readout data is outputted to memory cells C7 of the sub-mats for a high-order bit of all mats Mat0 to Mat7 and then, precharge signal /BLEQ is activated to "L" level. Thus, word line driver 24 deactivates word line WL to "L" level and then first precharge circuits PR0 to PR7 precharge all bit line pairs BL, /BL.

Thus, the above operations are repeated for the sub-mats for a low-order bit.

As described above, while precharging and activation/deactivation of word line are performed every access cycle with respect to data register 23 in the first mode, precharging and activation/deactivation are performed every eight accesses (for eight columns) to data register 23 in the second mode, so that power consumption can be saved in the second mode as compared with the first mode.

(Operation of IOSRAM Transfer)

When data is written in flash memory cell array, written data from the outside is transferred data register 23 through data input buffer 13, input data control circuit 17. This transfer is referred as IOSRAM transfer. Then, the data written in the data register 23 is transferred to the memory cell in flash memory cell array 20 through sense latch part 22. This transfer is referred to as a SRAMSL transfer.

The IOSTRAM transfer will be described hereinafter. The SRAMSL transfer will be described later.

At the IOSRAM transfer, written data is transferred from input data control circuit 17 to mats Mat0 Mat1, . . . Mat7 in data register 23 in this order. The written data is transferred to the memory cell of the sub-mat for a high-order bit and the memory cell of the sub-mat for a low-order bit in each mat at the same time. In each sub-mat, the written data is transferred to memory cells C0, C1, . . . C7 in this order.

Figure 8:
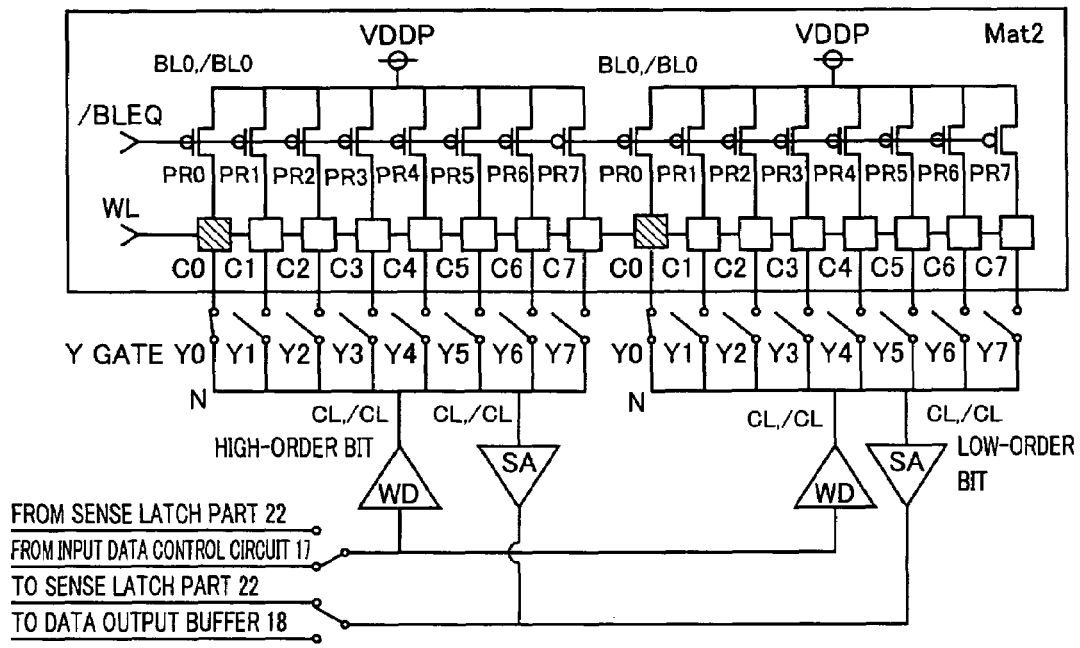
FIG. 8 is a view for explaining an operation of the data register and peripheral circuit group when the data from outside is transferred to memory cells in the sub-mat for a high-order bit and the sub-mat for a low-order bit in a mat in data register.

FIG. 8 is a view for explaining the operation of data register and peripheral circuit group 21 when data is transferred from the outside to memory cell C0 of the sub-mats for a high-order bit and sub-mat for a low-order bit of mat (Mat2) in data register 23.

Referring to FIG. 8, when data is transferred to memory cells C0 of the sub-mat for a high-order bit and sub-mat for a low-order bit of mat Mat2, Y gates Y0 of the sub-mat for a high-order bit and sub-mat for a low-order bit are turned ON and the data is transferred from write drivers WD to memory cells C0 of the sub-mat for a high-order bit and sub-mat for a low-order bit.

Figure 9:
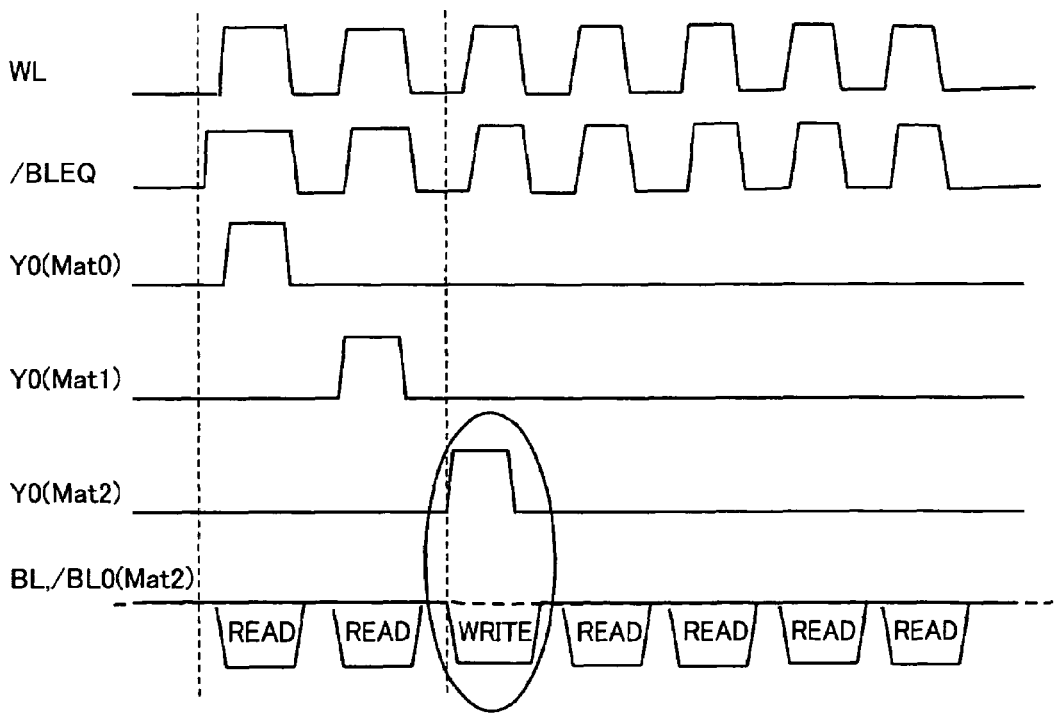
FIG. 9 is a schematic view showing a timing chart at an IOSRAM transfer in a first mode.

FIG. 9 is a schematic view showing a timing chart at the IOSRQM transfer in the first mode.

Referring to FIG. 9, precharge signal /BLEQ is deactivated to "H" level first. Thus, first precharge circuits PR0 to PR7 finish precharging of all bit line pairs BL, /BL.

In addition, in response to the deactivation of precharge signal /BLEQ to "H" level, word line driver 24 activates word line WL to "H" level.

Then, Y gates Y0 of the sub-mat for a high-order bit and sub-mat for a low-order bit of mat Mat0 are turned ON and the written data is outputted from write driver WD to memory cells C0 of the sub-mat for a high-order bit and sub-mat for a low-order bit of mat Mat0. Then, the precharge signal /BLEQ is activated to "L" level. Thus, word line driver 24 deactivates word line WL to "L" level and first precharge circuits PR0 to PR7 precharge all bit line pairs BL, /BL.

Then, precharge signal /BLEQ is deactivated to "H" level. Then, first precharge circuits PR0 to PR7 finish precharging of all bit line pairs BL, /BL. In addition, in response to the deactivation of precharge signal /BLEQ to "H," level, word line driver 24 activates word line WL to "H" level.

Then, Y gates Y0 of the sub-mat for a high-order bit and sub-mat for a low-order bit of mat Mat1 is turned ON and the written data is outputted from write driver WD to memory cells C0 of the sub-mat for a high-order bit and sub-mat for a low-order bit of mat Mat1. Then, the precharge signal /BLEQ is activated to "L" level. Thus, word line driver 24 deactivates word line WL to "L" level and first precharge circuits PR0 to PR7 precharge all bit line pairs BL, /BL.

Then, precharge signal /BLEQ is deactivated to "H" level. Then, first precharge circuits PR0 to PR7 finish precharging of all bit line pairs BL, /BL. In addition, in response to the deactivation of precharge signal /BLEQ to "H" level, word line driver 24 activates word line WL to "H" level.

Then, Y gates Y0 of the sub-mat for a high-order bit and sub-mat for a low-order bit of mat Mat2 are turned ON and the written data is outputted from write driver WD to memory cells C0 of the sub-mat for a high-order bit and sub-mat for a low-order bit of mat Mat2. At this time, as shown in FIG. 9, bit line pairs BL0, /BL0 connected to memory cells C0 of the sub-mat for a high-order bit and sub-mat for a low-order bit of mat Mat2 are changed to the level corresponding to the written data.

Then, the above operations are repeated with respect to Y gates Y0 of remaining mats Mat3 to Mat7 and then, the above operations are repeated with respect to Y gates Y1 to Y7 of mats Mat0 to Mat7.

Figure 10:
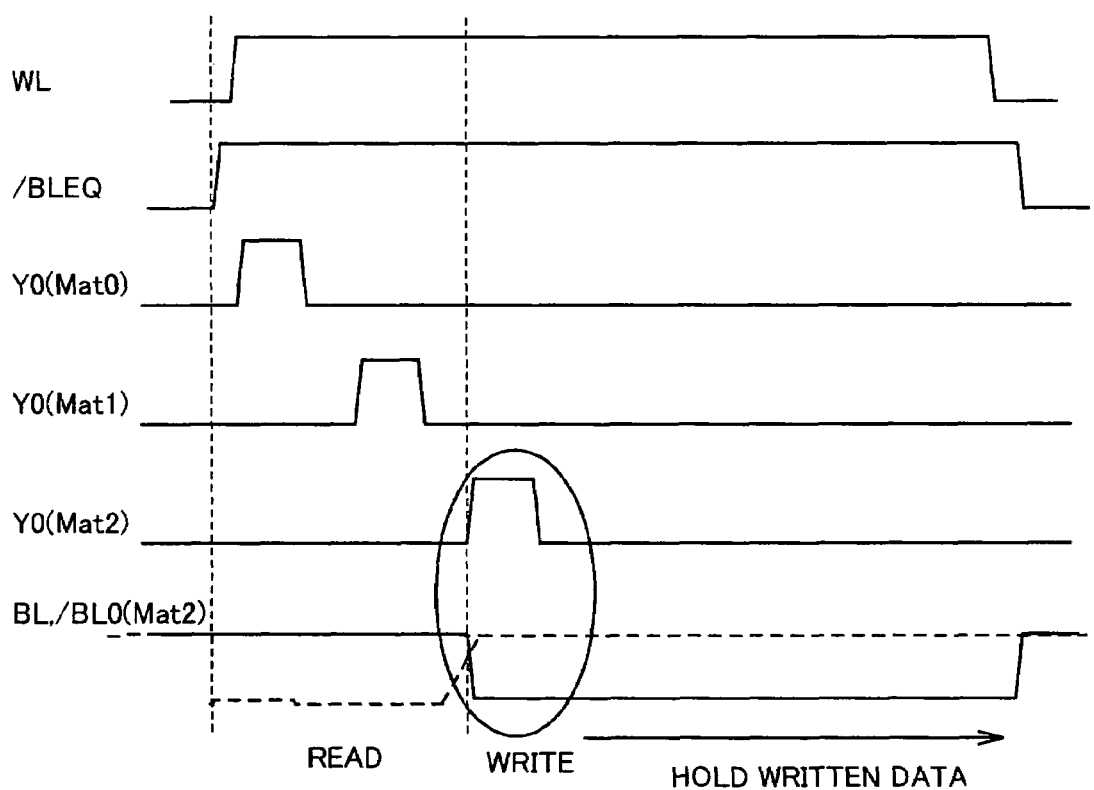
FIG. 10 is a schematic view showing a timing chart at the IOSRAM transfer in a second mode.

FIG. 10 is a schematic view showing a timing charge at the IOSTAM transfer in the second mode.

Referring to FIG. 10, precharge signal /BLEQ is deactivated to "H" level first. Thus, first precharge circuits PR0 to PR7 finish precharging of all bit line pairs BL, /BL.

In addition, in response to the deactivation of precharge signal /BLEQ to "H" level, word line driver 24 activates word line WL to "H" level.

Then, Y gates Y0 of the sub-mat for a high-order bit and sub-mat for a low-order bit of mat Mat0 are turned 0N and the written data is outputted from write driver WD to memory cells C0 of the sub-mat for a high-order bit and sub-mat for a low-order bit of mat Mat0.

Then, Y gates Y0 of the sub-mat for a high-order bit and sub-mat for a low-order bit of mat Mat1 is turned ON and the written data is outputted from write driver WD to memory cells C0 of the sub-mat for a high-order bit and sub-mat for a low-order bit of mat Mat1.

Then, Y gates Y0 of the sub-mat for a high-order bit and sub-mat for a low-order bit of mat Mat2 is turned ON and the written data is outputted from write driver WD to memory cells C0 of the sub-mat for a high-order bit and sub-mat for a low-order bit of mat Mat2. At this time, as shown in FIG. 10, bit line pairs BL0, /BL0 connected to memory cells C0 of the sub-mat for a high-order bit and sub-mat for a low-order bit of mat Mat2 are changed to the level corresponding to the written data.

Then, the above operations are repeated with respect to Y gates Y0 of remaining mats Mat3 to Mat7 and then, the above operations are repeated with respect to Y gates Y1 to Y7 of mats Mat0 to Mat7.

When Y gates Y7 of the sub-mat for a high-order bit and sub-mat for a low-order bit of final mat Mat7 are turned ON, the written data is outputted to memory cells C7 of the sub-mat for a high-order bit and sub-mat for a low-order bit of mat Mat7 and then precharge signal/BLEQ is activated to "L" level. Then, word line driver 24 deactivates word line WL to "L" level and then first precharge circuits PR0 to PR7 precharge all bit line pairs BL, /BL.

As described above, while precharging and activation/deactivation of word line are performed every access cycle with respect to data register 23 in the first mode, precharging and activation/deactivation are performed of the every 64 accesses (8 mats×8 columns) to data register 23 in the second mode, so that power consumption can be saved in the second mode as compared with the first mode.

(Operation of SRAMSL Transfer)

The precharge timing of the SRAMSL transfer is basically the same as that of the SLSRAM transfer. However, while write driver WD outputs data to the memory cell in the SLSRAM transfer, the data in the memory cell is outputted to sense amplifier SA in SRAMSL transfer.

At the SRAMSL transfer, data is read out from memory cells C0 of the sub-mats for a high-order bit and sub-mats for a low-order bit of all mats in data register 23 at the same time and sent to sense amplifiers SA. The sense amplifier SA calculates the data for a high-order bit and the data for a low-order bit and determines whether the data is written in the flash memory or not according to the calculated result and outputs the data to the sense latch when the data is to be written. Then, the same operations are performed in memory cells C1, . . . , C7 in this order.

(Operation of SRAMIO Transfer)

The precharge timing of the SRAMIO transfer is basically the same as that of the IOSRAM transfer. However, while write driver WD outputs data to the memory cell in the IOSRAM transfer, the data in the memory cell is outputted to sense amplifier SA in the SRAMIO transfer.

(Constitution of Precharge Signal Generation Circuit 50)

Figure 11:
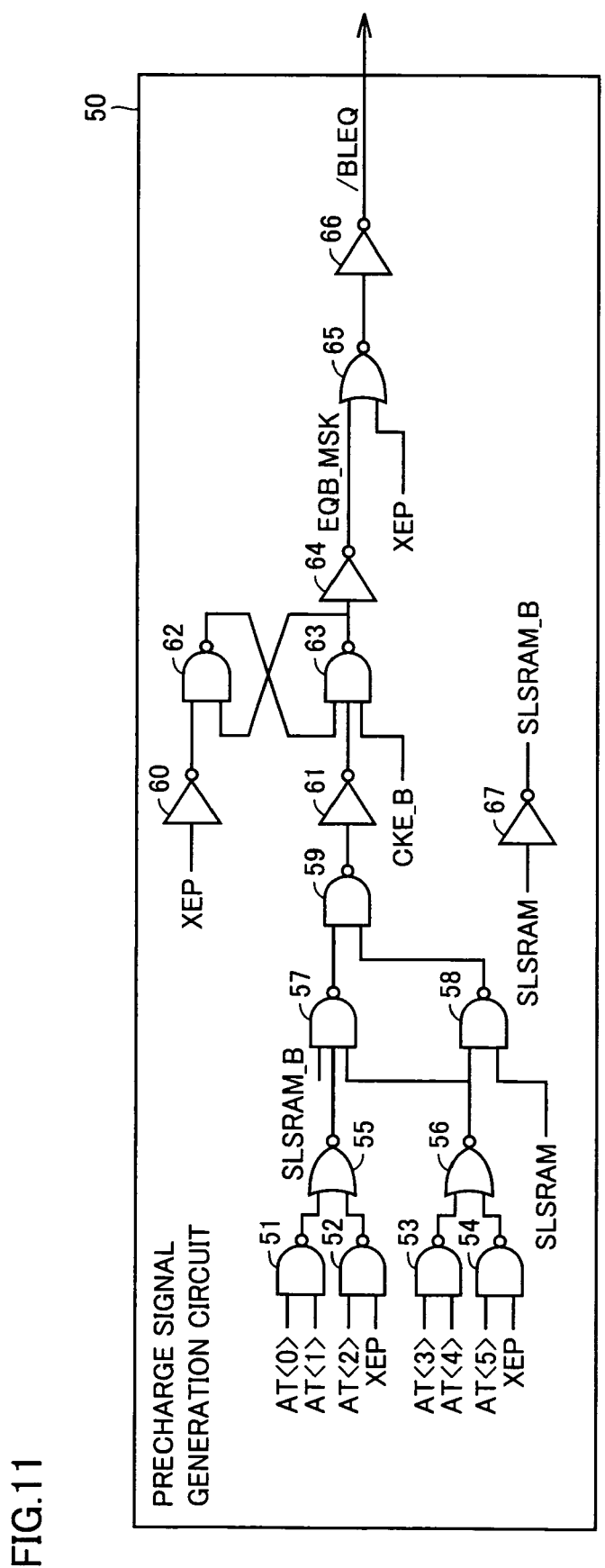
FIG. 11 is a schematic view showing a constitution of a precharge signal generation circuit.

FIG. 11 is a schematic view showing the constitution of precharge signal generation circuit 50.

Referring to FIG. 11, precharge signal generation circuit 50 includes NAND circuits 51 to 54, NOR circuits 55 and 56, NAND circuits 57 to 59, inverters 60 and 61, NAND circuits 62 and 63, an inverter 64, an NOR circuit 65, an inverter 66, and an inverter 67.

Precharge signal generation circuit 50 receives internal address signals AT<0> to AT<5>, an internal clock signal XEP, a mode designation signal CKE_B and a transfer destination designation signal SLSRAM.

When the first mode is designated, mode designation signal CKE_B becomes "L" level. When the second mode is designated, mode designation signal CKE_B becomes "H" level. In addition, when the SLSRAM transfer and the SRAMSL transfer are designated, transfer destination designation signal SLSRAM becomes "H" level. When the IOSRAM transfer and the SRAMIO transfer are designated, transfer destination designation signal SLRAM becomes "L" level.

Internal clock signal XEP includes a pulse every reading or writing cycle.

When the first mode is designated (when mode designation signal CKE_B is at "L" level), a precharge mask signal EQBMSK is deactivated to "L" level. Thus, masking is not performed by the precharge mask signal, and precharge signal/BLEQ including a pulse every cycle generated by a pulse of internal clock XEP is outputted from NOR circuit 65 and inverter 66.

When the second mode is designated (when mode designation signal CKE_B is at "H" level) and when the SLSRAM transfer or the SRAMSL transfer is designated (when transfer destination designation signal SLSRAM is at "H" level), the column address in the sub-mat is designated by internal address signals AT<3> to AT<5>. When the designated column address is not a maximum column address, that is, when any of internal address signals AT<3> to AT<5> is at "L" level, precharge mask signal EQB_MSK is activated to "H" level. Thus, the signal including a pulse every cycle generated by internal clock XEP is masked by the precharge mask signal, and precharge signal/BLEQ fixed to "H" level showing deactivation is outputted regardless of the change of internal clock XEP.

Meanwhile, when the designated column address is the maximum column address, that is, when all internal address signals AT<3> to AT<5> are at "H" level, precharge mask signal EQB_MSK is deactivated to "L" level. Thus, the masking by the precharge mask signal is canceled and precharge signal/BLEQ including a pulse every cycle generated by the change of internal clock XEP is outputted.

When the second mode is designated (when mode designation signal CKE_B is at "H" level) and when the IOSRAM transfer or the SRAMIO transfer is designated (when transfer destination designation signal SLSRAM is at "H" level), the column address in the sub-mat is designated by internal address signals AT<3> to AT<5>, and any one of eight mats Mat0 to Mat7 is designated by internal address signals AT<0> to AT<2>. When the designated mat is not the last mat Mat7 or the designated column address is not the maximum column address, that is, when any of internal address signal AT<0> to AT<5> is at "L" level, precharge mask signal EQB_MSK is activated to "H" level. Thus, the signal including a pulse every cycle generated by internal clock XEP is masked by the precharge mask signal, and precharge signal/BLEQ fixed to "H" level showing deactivation is outputted regardless of the change of internal clock XEP.

Meanwhile, when the designated mat is the last mat Mat7 and the designated column address is the maximum column address, that is, when all internal address signal AT<0> to AT<5> are at "H" level, precharge mask signal EQB_MSK is deactivated to "L" level. Thus, the masking by precharge mask signal is canceled and precharge signal/BLEQ including the pulse every cycle generated by the change of internal clock XEP is outputted.

In addition, precharge signal generation circuit 50 outputs precharge signal/BLEQ at "L" level showing activation by means (a logical circuit receiving a signal showing a standby state) (not shown) at standby, in both first and second modes. Here, the time of standby means a state in which reading or writing operation is not performed in nonvolatile semiconductor memory device 100.

(Details About Timing Chart at the SLSRAM Transfer in Second Mode)

Figure 12:
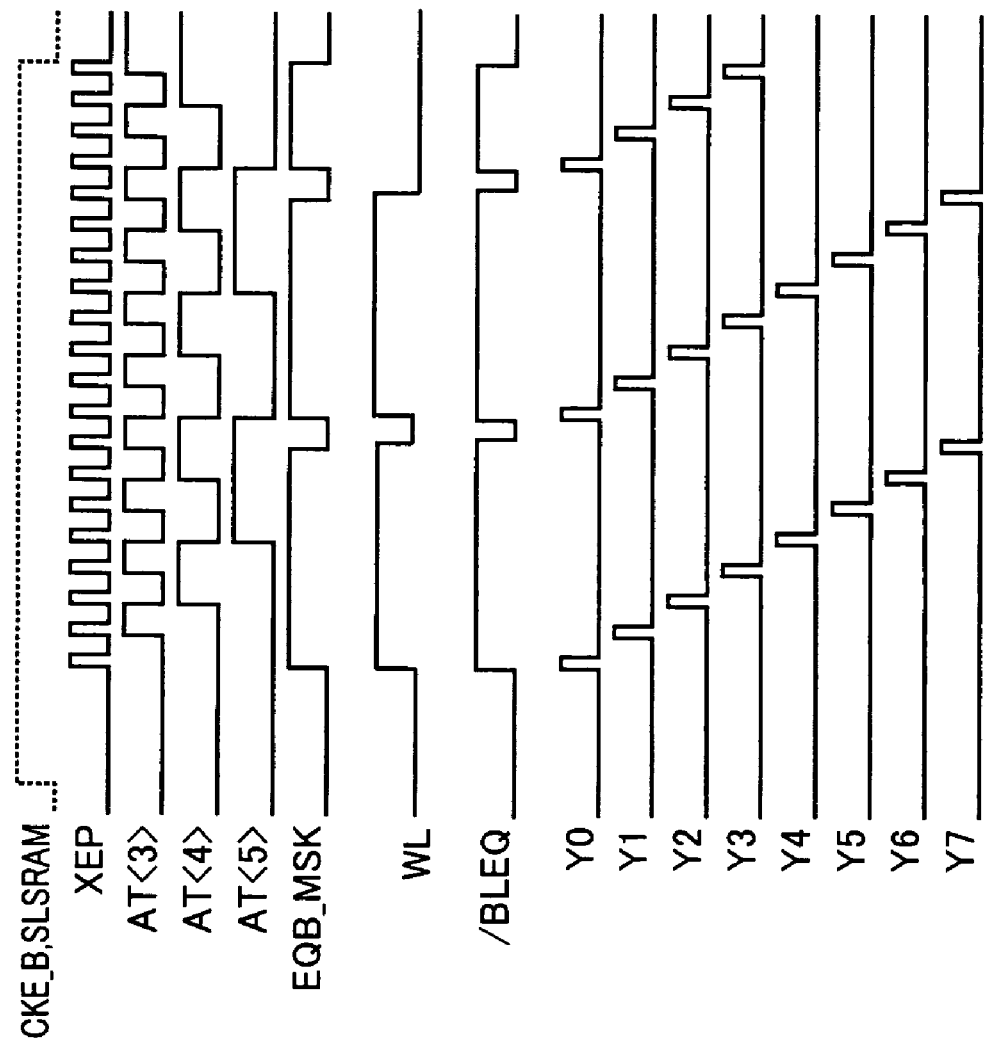
FIG. 12 is a detailed view showing a timing chart at the SLSRAM transfer in the second mode.

FIG. 12 is a detailed view showing the timing chart at the SLSRAM transfer in the second mode.

Referring to FIG. 12, precharge signal/BLEQ is activated to "L" level at standby. Thus, word line WL designated by an internal address signal (except for signals AT<0> to AT<5>) is deactivated and bit line pair BL, /BL is precharged.

Then, mode designation signal CKE_B becomes "H" level and transfer destination designation signal SLSRAM becomes "H" level.

Then, when internal address signal (AT<3> to AT<5> are all at "L" level) designating head columns (0-th) of the sub-mats for a high-order bit of mats Mat0 to Mat7 are inputted, precharge mask signal EQB_MSK is activated to "H" level. Thus, precharge signal/BLEQ is deactivated to "H" level. When precharge signal/BLEQ is deactivated to "H" level, word line WL designated by the internal address signal (except for AT<0> to AT<5>) is activated.

Furthermore, Y gates Y0 corresponding to the head columns of the sub-mats for a high-order bit of mats Mat0 to Mat7 are turned ON by internal address signal (AT<3> to AT<5> are all at "L" level), and data is transferred to memory cell C0 of that column.

Similarly, internal address signals designating first to sixth columns of the sub-mats for a high-order bit of mats Mat0 to Mat7 are sequentially inputted and Y gates Y1 to Y6 of those columns are turned ON and data is transferred to memory cells C1 to C6 of those columns, while precharge mask signal EQB_M is kept at "H" level and precharge signal/BLEQ is kept deactivated at "H" level.

When internal address signal (AT<3> to AT<5> are all "H" level) designating the columns (seventh) of the sub-mats for a high-order bit of mats Mat0 to Mat7 is inputted, Y gates Y7 corresponding to the seventh columns of the sub-mats for a high-order bit of mats Mat0 to Mat7 are turned ON and data is transferred to memory cell C7 of that column.

Furthermore, precharge mask signal EQB_MSK is deactivated to "L" level by the internal address signal (AT<3> to AT<5> are all at "H" level) and the masking is canceled. Thus, precharge signal/BLEQ becomes a signal including the pulse every cycle generated by the change of internal clock XEP. When precharge signal/BLEQ is activated to "L" level, word line WL designated by the internal address signal is deactivated and bit line pair BL, /BL is precharged.

Thus, the above operations are repeated with respect to memory cells of the sub-mats for a low-order bit of mats Mat0 to Mat7.

(Details About Timing Chart at the SRAMSL Transfer in Second Mode)

Since this is the same as the timing chart in FIG. 12, the description will not be repeated. However, according to the SRAMSL transfer, the data in the memory cell is outputted to sense amplifier SA.

(Details About Timing Chart at the IOSRAM Transfer in Second Mode)

Figure 13:
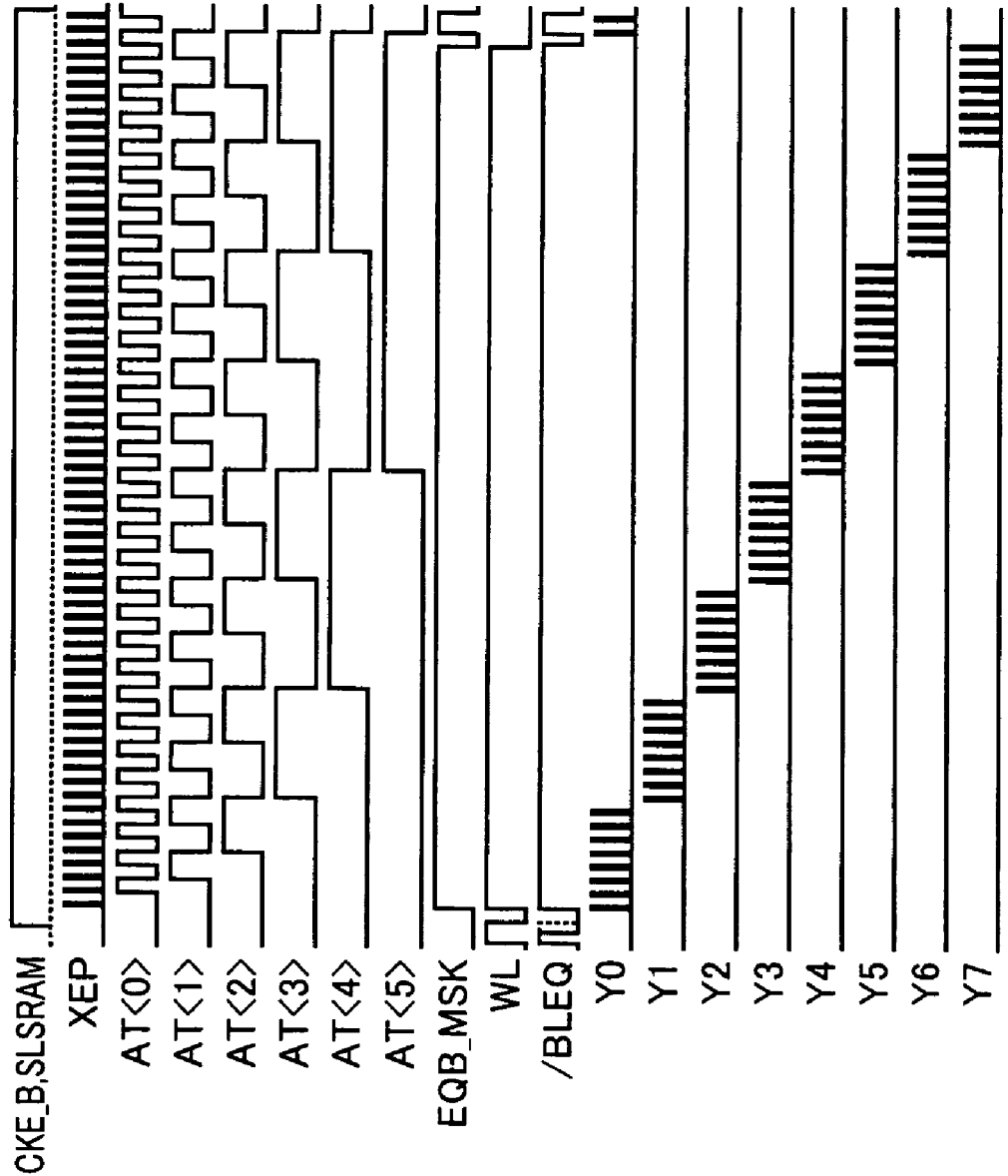
FIG. 13 is a detailed view showing a timing chart at the IOSRAM transfer in the second mode.

FIG. 13 is a detailed view showing the timing chart at the IOSRAM transfer in the second mode.

Referring to FIG. 13, precharge signal/BLEQ is activated to "L" level at standby. Thus, word line WL designated by an internal address signal (except for signals AT<0> to AT<5>) is deactivated and bit line pair BL, /BL is precharged.

Then, mode designation signal CKE_B becomes "H" level and transfer destination designation signal SLSRAM becomes "L" level.

Then, when the internal address signal (AT<0> to AT<5> are all at "L" level) designating head columns (0-th) of the sub-mats for a high-order bit and sub-mat for a low-order bit of mat Mat0 is inputted, precharge mask signal EQB_MSK is activated to "H" level. Thus, precharge signal/BLEQ is deactivated to "H" level. When precharge signal/BLEQ is deactivated to "H" level, word line WL designated by the internal address signal (except for AT<0> to AT<5>) is activated.

Furthermore, Y gates Y0 corresponding to the head columns of the sub-mats for a high-order bit and sub-mat for a low-order bit of mat Mat0 are turned ON by the internal address signal (AT<0> to AT<5>are all at "L" level), and data is transferred to memory cell C0 of that column.

Similarly, internal address signals corresponding to the head columns (0-th) of the sub-mats for a high-order bit and sub-mat for a low-order bit are inputted to mats Mat1, Mat2, . . . Mat7 in this order and Y gate Y0 of the column is turned ON and data is transferred to memory cell C0 of the column. Similarly, as for the first column, an internal address signal is inputted to mats Mat0, Mat2, . . . Mat7 in this order and Y gates Y1 of sub-mats for a high-order bit and sub-mat for a low-order bit are turned ON and data is transferred to memory cell C1 of the column.

The above operations are repeated for the second to seventh column, while precharge mask signal EQB_MSK is kept at "H" level and precharge signal/BLEQ is kept deactivated at "H" level.

When internal address signal (AT<0> to AT<5> are all "H" level) designating the last columns (seventh) of the sub-mats for a high-order bit and sub-mat for a low-order bit of mats Mat0 to Mat7 are inputted, Y gates Y7 corresponding to the seventh columns of the sub-mats for a high-order bit and sub-mat for a low-order bit of mats Mat0 to Mat7 are turned ON and data is transferred to memory cell C7 of that column.

Furthermore, precharge mask signal EQB_MSK is deactivated to "L" level by internal address signal (AT<0> to AT<5> are all "H" level) and the masking is canceled. Thus, precharge signal/BLEQ becomes the signal including a pulse every cycle generated by the change of internal clock XEP. When precharge signal/BLEQ is activated to "L" level, word line WL designated by the internal address signal is deactivated and bit line pair BL, /BL is precharged.

(Details About Timing Chart at the SRAMIO Transfer in Second Mode)

As is the same as the timing chart in FIG. 13, the description will not be repeated. However, according to the SRAMIO transfer, the data in the memory cell is outputted to sense amplifier SA.

As apparent from the above description, nonvolatile semiconductor memory device 100 according to the present invention can be operated by selecting one of the first mode for precharging the bit line pair every access cycle with respect to the memory cell in the data register and the second mode for precharging the bit line pair when a specific memory cell in the data register is accessed, realizing a flexible use.

(Variation)

The present invention is not limited to the above embodiment and it may include the following variation.

(1) Start of Access from Column of Middle Column Address in Data Register 23

Although above description has been made on a case where data reading and writing are performed from the head column of the minimum address to the last column of the maximum address in data register 23, the present invention is not limited to this. For example, data reading and writing may be started from a column of a middle column address in data register 23.

Even when precharge signal generation circuit 50 shown in FIG. 11 starts data reading and writing from the column of the middle column address in data register 23, it outputs precharge signal/BLEQ at "L" level showing activation by means (not shown) in both first and second modes at standby.

In addition, even in a case where precharge signal generation circuit 50 shown in FIG. 11 stars data reading and writing from the column of the middle column address in data register 23, when the second mode is designated and the SLSRAM transfer is designated and the designated column address reaches the maximum column address, precharge mask signal EQB_MSK is deactivated to "L" level. Thus, masking by the precharge mask signal is canceled and precharge signal/BLEQ including the pulse every cycle generated by the change of internal clock XEP is outputted.

In addition, even in a case where precharge signal generation circuit 50 shown in FIG. 11 stars data reading and writing from the column of the middle column address in data register 23, when the second mode is designated and the IOSRAM transfer is designated and when the designated mat is the last mat Mat7 and the designated column address reaches the maximum column address, precharge mask signal EQB_MSK is deactivated to "L" level. Thus, masking by the precharge mask signal is canceled and precharge signal/BLEQ including the pulse every cycle generated by the change of internal clock XEP is outputted.

Thus, a description will be made on a case where data reading and writing is performed from the column of the middle column address in data register 23.

(a) Example of Reading from Column of Middle Column Address in Data Register 23

Figure 14A:
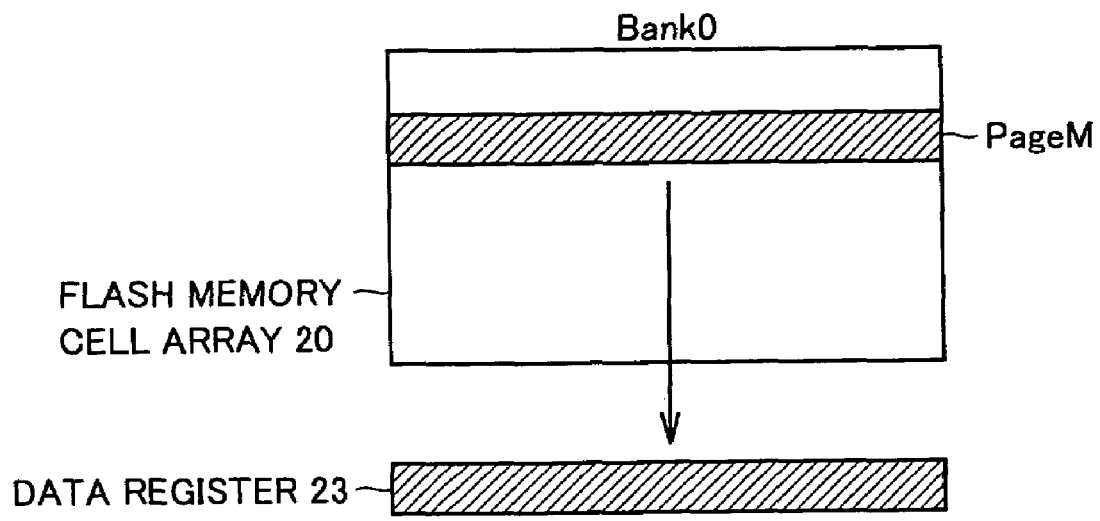
FIGS. 14A and 14B are views for explaining an operation of randomly outputting data in a page of flash memory cell array.
Figure 14B:
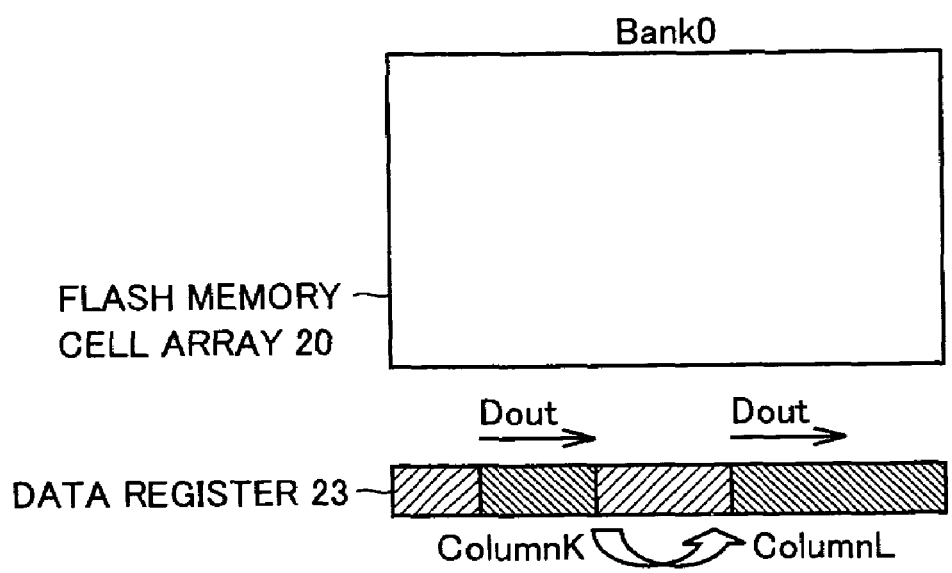

FIGS. 14A and 14B are views for explaining the operation of randomly outputting data in the page of flash memory cell array 20 to the outside.

As shown in FIG. 14A, data in page M of flash memory cell array 20 is transferred to data register 23 first.

Then, as shown in FIG. 14B, the data of column K in data register 23 is outputted to the outside through the data input/output terminal and then the data is sequentially outputted to the outside from column L which is not adjacent to column K through the data input/output terminal until the last column.

(b) Example of Writing to Column of Middle Column Address in Data Register 23

Figure 15A:
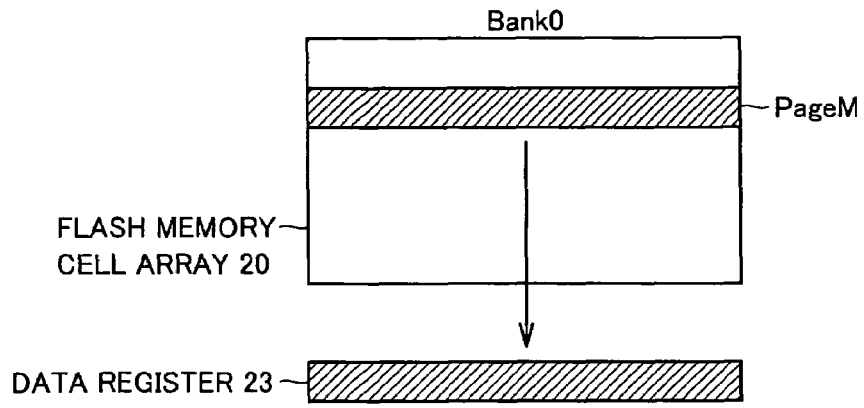
FIGS. 15A, 15B and 15C are views for explaining an operation of randomly updating the data in the page of flash memory cell array.
Figure 15B:
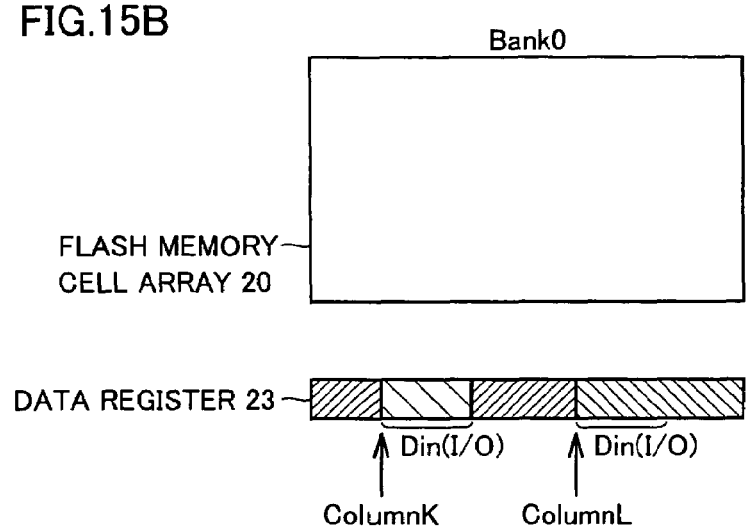
Figure 15C:
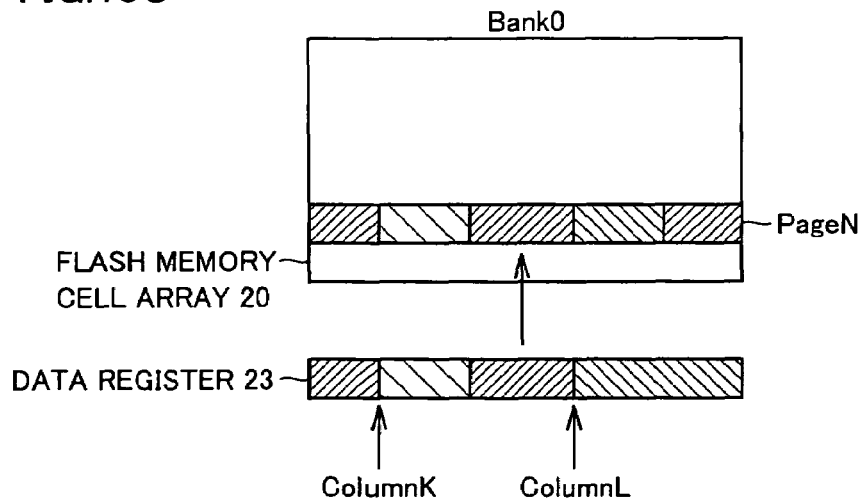

FIGS. 15A, 15B and 15C are views for explaining the operation of randomly updating the data in the page of flash memory cell array 20.

As shown in FIG. 15A, the data in page M in flash memory cell array 20 is transferred to data register 23.

Then, as shown in FIG. 15B, the data in column K in data register 23 is updated to data from the outside through the data input/output terminal.

Then, the data in data register 23 is written in page M of the flash memory.

(2) Precharge of Common Wiring Pair CL, /CL Connected to Sense Amplifier SA

According to this embodiment of the present invention, common wiring pair CL, /CL is not precharged.

However, in a case where common wiring pair CL, /CL is not precharged every reading cycle and where the driving ability of the memory cell is low, when the data is read from the present memory cell, the potential at the common wiring pair generated by the data read from the previous memory cell cannot be changed in accordance with the data read from the present memory cell in some cases. Thus, a description will be made of the constitution for precharging common wiring pair CL, /CL every reading cycle, hereinafter.

Figure 16:
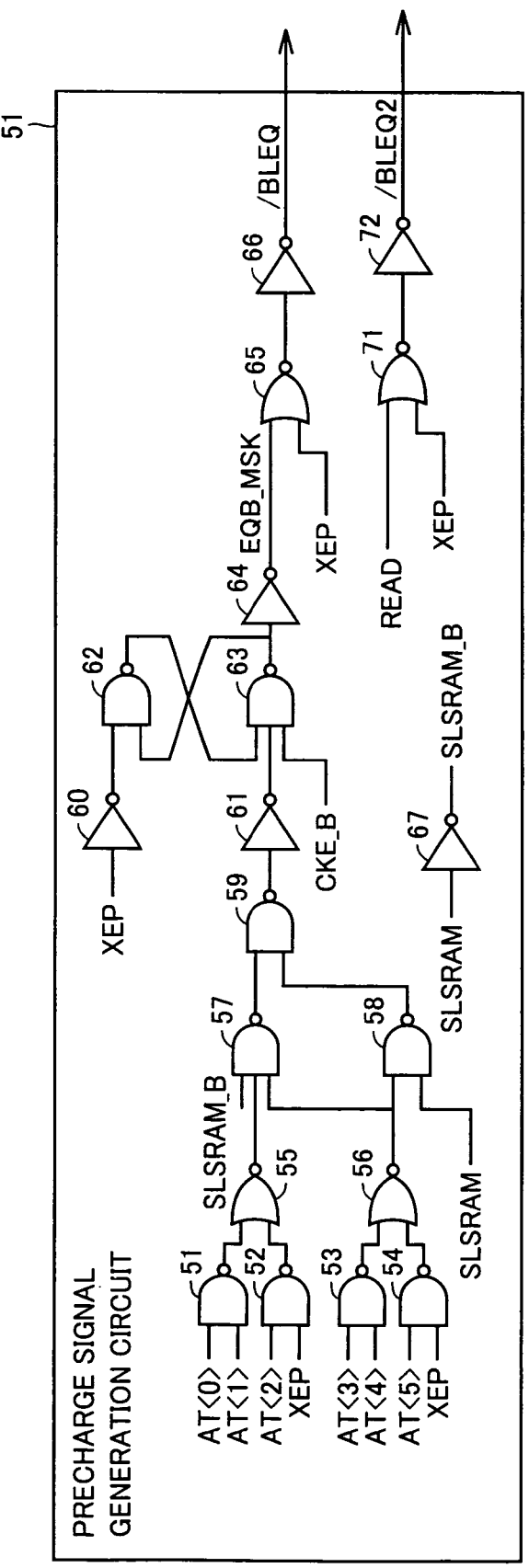
FIG. 16 is a view showing a precharge signal generation circuit according to a variation.

FIG. 16 is a view showing a precharge signal generation circuit 51 in a variation.

Referring to FIG. 16, precharge signal generation circuit 51 in the variation further includes an NOR circuit 71 and an inverter 72 in addition to the circuits included in precharge signal generation circuit 50 shown in FIG. 11, and outputs another precharge signal/BLEQ2 in addition to precharge signal/BLEQ. A read designation signal READ becomes "L" level when data is read from data register 23. Thus, at the time reading from data register 23, precharge signal/BLEQ2 includes a pulse every cycle generated by the change of internal clock XEP is outputted.

Figure 17:
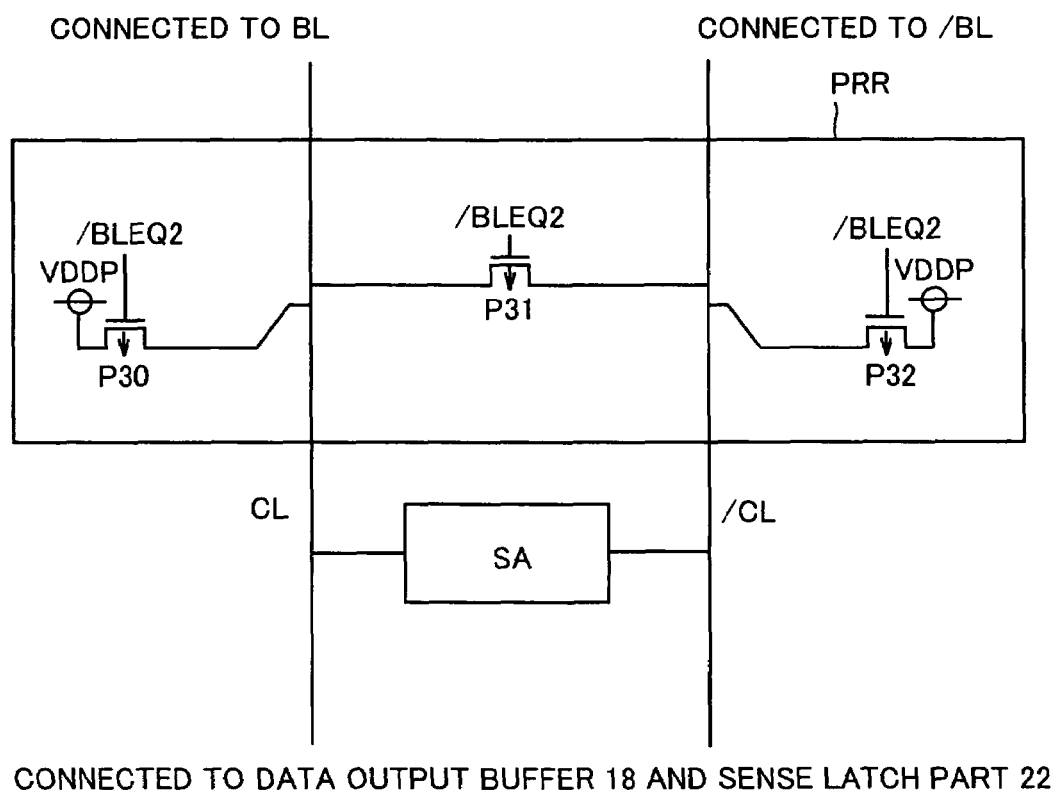
FIG. 17 is a view showing a second precharge circuit.

FIG. 17 is a view showing a second precharge circuit PRR.

Referring to FIG. 17, second precharge circuit PRR includes P channel MOS transistors P30, P31 and P32. P channel MOS transistors P30, P31 and P32 are turned ON when precharge signal/BLEQ2 becomes "L" level, and as a result, both common wiring lines CL and /CL are precharged to the potential of VDDP.

(3) Constitution of Memory Cell in Sub-Mat

Although each sub-mat in data register 23 includes memory cells having one row and eight columns in the embodiment of the present invention, the present invention is not limited to this. For example, each sub-mat may include memory sells having X row (X is an integer not less than 1) and may have Y column (Y is an integer not less than 1).

(4) Constitution of Sub-Mat

Although each mat in data register 23 includes the sub-mat for a high-order bit and sub-mat for a low-order bit in accordance with two bits stored in the memory cell of flash memory cell array 20. When the memory cell in flash memory cell array 20 stores N-bit data (N is an integer not less than 1), each mat in data register 23 may include N sub-mats in accordance with the bits stored in the memory cell in flash memory cell array 20.

In addition, according to this embodiment of the present invention, each mat includes a pair of sub-mats for a high-order bit and low-order bit in accordance with two bits of the memory cell in flash memory cell array 20. However, L (L is positive integer not less than 1) pair of sub-mats for a high-order bit and low-order bit may be provided. In this case, at writing (SLSRAM transfer and IOSRAM transfer) to the data register, data is written in L sub-mats at the same time and at reading (SRAMSL transfer and SRAMIO transfer) from the data register, data is read from the L sub-mats at the same time.

(5) The Number of Mats, the Number of Banks, and Bit Constitution of Bus

The number of mats, the number of banks, the bit constitution of the bus between sense latch portion 22 and data register 23, the bit constitution of the bus between input data control circuit 17 and data register 23, and bit constitution of the bus between data output buffer 18 and data register 23 described in the embodiment of the present invention are one example and the present invention is not limited to these.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:

a nonvolatile memory cell array including a plurality of memory cells;

a data register including a plurality of memory cells, for temporarily holding read data from said nonvolatile memory cell array and written data to said nonvolatile memory cell array;

a signal generation circuit for outputting a first signal including a pulse every reading or writing cycle with respect to said data register in a first mode, and outputting a second signal as the first signal, wherein the second signal is generated by masking the first signal including the pulse every reading or writing cycle with respect to said data register when reading or writing with respect to a memory cell other than a predetermined memory cell in said data register is designated in a second mode; and a first precharge circuit for precharging a bit line pair connected to the memory cell in said data register in response to activation of said first signal, wherein said signal generation circuit cancels said masking when reading or writing with respect to said predetermined memory cell in said data register is designated in said second mode.

2. The nonvolatile semiconductor memory device according to claim 1, wherein a position of the memory cell in said data register in a column direction is designated by a column address, and said predetermined memory cell has a maximum column address.

3. The nonvolatile semiconductor memory device according to claim 2, further comprising:

a sense amplifier connected to a common wiring pair connected to a common connection node of the plurality of bit line pairs in said data register, and a Y gate connecting the bit line pair corresponding to the designated column address to said sense amplifier.

4. The nonvolatile semiconductor memory device according to claim 3, further comprising a second precharge circuit for precharging the common wiring pair connected to said sense amplifier, wherein said signal generation circuit further outputs a third signal including a pulse every reading cycle with respect to said data register in the first and second modes, and said second precharge circuit precharges the common wiring pair connected to said sense amplifier in response to the activation of said second signal.

5. The nonvolatile semiconductor memory device according to claim 2, wherein in said second mode, said signal generation circuit outputs the activated first signal at standby, and cancels said masking when said designated column address reaches the maximum even when reading or writing access is started from a column having an column address other than a minimum column address in said data register.

6. The nonvolatile semiconductor memory device according to claim 1, further comprising a word line driver for controlling the activation of a word line connected to the memory cell in said data register, wherein said word line driver deactivates said word line in response to the activation of said first signal.

7. The nonvolatile semiconductor memory device according to claim 1, wherein the memory cell included in said data register is a SRAM cell.

8. The nonvolatile semiconductor memory device according to claim 1, further comprising a sense latch for holding read data from said nonvolatile memory array, wherein the memory cell in said nonvolatile memory array holds N-bit (N is an integer not less than 1) data, said data register is divided into M (M is an integer not less than 2) mats, said each mat includes N sub-mats in accordance with said N bits, positions of the memory cells in said each sub-mat in a column direction are designated by a first to K-th (K is an integer not less than 2) column addresses, said sense latch simultaneously transfers said read data to the memory cells having the designated column addresses in the sub-mat having a designated order in each of M mats, and said predetermined memory cell has the K-th column address.

9. The nonvolatile semiconductor memory device according to claim 1, further comprising an input control circuit for controlling transfer of N-bit (N is an integer not less than 1) written data from outside to said data register, wherein said nonvolatile memory array holds the N-bit data, said data register is divided into M (M is an integer not less than 2) mats, said each mat includes N sub-mats in accordance with said N bits, positions of the memory cells in said each sub-mat in a column direction are designated by a first to K-th (K is an integer not less than) column addresses, said input control circuit simultaneously transfers said written data to the memory cells having the designated column addresses in N pairs of sub-mats in the mat having a designated order, and said predetermined memory cell has the K-th column address of the M-th mat.

* * * * *